United States Patent
Oh et al.

(10) Patent No.: US 8,372,303 B2
(45) Date of Patent: Feb. 12, 2013

(54) CERIUM OXIDE POWDER, METHOD FOR PREPARING THE SAME, AND CMP SLURRY COMPRISING THE SAME

(75) Inventors: Myoung Hwan Oh, Daejeon (KR); Seung Beom Cho, Daejeon (KR); Jun Seok Nho, Daejeon (KR); Jong Pil Kim, Daejeon (KR); Jang Yul Kim, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 12/309,694

(22) PCT Filed: Jul. 26, 2007

(86) PCT No.: PCT/KR2007/003579
§ 371 (c)(1),
(2), (4) Date: Jan. 27, 2009

(87) PCT Pub. No.: WO2008/013407
PCT Pub. Date: Jan. 31, 2008

(65) Prior Publication Data
US 2010/0009539 A1 Jan. 14, 2010

(30) Foreign Application Priority Data

Jul. 28, 2006 (KR) .................. 10-2006-0071703
Jul. 28, 2006 (KR) .................. 10-2006-0071713
May 11, 2007 (KR) .................. 10-2007-0046206

(51) Int. Cl.
*C09K 13/00* (2006.01)
*C03C 15/00* (2006.01)

(52) U.S. Cl. ........... 252/79.1; 216/88; 216/89; 438/692; 438/693; 51/298; 51/309

(58) Field of Classification Search ................ 252/79.1; 216/88, 89; 438/692, 693; 51/298, 309
See application file for complete search history.

(56) References Cited

U.S. PATENT DOCUMENTS

| 6,053,956 A | 4/2000 | Wood |
| 6,343,976 B1 | 2/2002 | Yoshida et al. |
| 6,420,269 B2 | 7/2002 | Matsuzawa et al. |

(Continued)

FOREIGN PATENT DOCUMENTS

| JP | 07-081932 A | 3/1995 |
| JP | 2005-39286 | * 2/2005 |

(Continued)

OTHER PUBLICATIONS

Machine English Translation of JP-2005-39286, Feb. 2005.*

(Continued)

*Primary Examiner* — Shamim Ahmed
(74) *Attorney, Agent, or Firm* — Rothwell, Figg, Ernst & Manbeck, P.C.

(57) ABSTRACT

Disclosed is cerium oxide powder for a CMP abrasive, which can improve polishing selectivity of a silicon oxide layer to a silicon nitride layer and/or within-wafer non-uniformity (WI-WNU) during chemical mechanical polishing in a semiconductor fabricating process. More particularly, the cerium oxide powder is obtained by using cerium carbonate having a hexagonal crystal structure as a precursor. Also, CMP slurry comprising the cerium oxide powder as an abrasive, and a shallow trench isolation method for a semiconductor device using the CMP slurry as polishing slurry are disclosed.

8 Claims, 3 Drawing Sheets

U.S. PATENT DOCUMENTS

| | | | |
|---|---|---|---|
| 2005/0176580 A1* | 8/2005 | Osaka et al. | 502/339 |
| 2006/0032150 A1 | 2/2006 | So et al. | |
| 2006/0150526 A1* | 7/2006 | Ota et al. | 51/307 |
| 2006/0162260 A1 | 7/2006 | Nho et al. | |
| 2006/0248804 A1 | 11/2006 | Yoshida et al. | |
| 2008/0176982 A1* | 7/2008 | Haga et al. | 524/366 |
| 2008/0236050 A1* | 10/2008 | Nho et al. | 51/298 |

FOREIGN PATENT DOCUMENTS

| | | |
|---|---|---|
| KR | 10-0403719 B1 | 10/2003 |
| KR | 10-2006-0005794 | 1/2006 |
| KR | 10-2006-0014658 | 2/2006 |
| KR | 10-2006-0014659 | 2/2006 |
| WO | 0136332 A1 | 5/2001 |
| WO | WO-2004/037722 A1 * | 6/2004 |

OTHER PUBLICATIONS

Guo et al ("Synthesis and Characterization of Single-Crystal Ce(OH)CO3 and CeO2 Triangular Microplates"; Inorganic Chem. 2006, 45, 4167-4169).*

Guo, Z., et al., Synthesis and Characterization of Single-Crystal Ce(OH)CO3 and CeO2 Triangular Microplates., Inorganic Chemistry, 2006, vol. 45, 4167-9.

Hoshino et al., "Mechanism of polishing of SiO2 films by CeO2 particles", Journal of Non-Crystalline Solids, 283 (2001), 129-136.

Minamidate, Y., et al., "Synthesis and characterization of plate-like ceria particles for cosmetic application", Materials Chemistry and Physics, 2010, vol. 123, 516-520.

Office Action issued on Feb. 8, 2012 in co-pending U.S. Appl. No. 12/076,649, 9 pages.

* cited by examiner (a)

(b)

(c)

(d)

CERIUM OXIDE POWDER, METHOD FOR PREPARING THE SAME, AND CMP SLURRY COMPRISING THE SAME

This application claims priority to PCT/KR2007/003579 filed on Jul. 26, 2007 along with Korean Patent Application No. 10-2006-71703 filed on Jul. 28, 2006, Korean Patent Application No. 10-2006-71713 filed on Jul. 28, 2006, and Korean Patent Application No. 10-2006-46206 filed on May 11, 2007, all of which contents are hereby incorporated by reference in their entirety.

TECHNICAL FIELD

The present invention relates to cerium oxide powder for a CMP abrasive, which can improve polishing selectivity of a silicon oxide layer to a silicon nitride layer and/or within-wafer non-uniformity (WIWNU) during chemical mechanical polishing in a semiconductor fabricating process. Also, the present invention relates to CMP slurry comprising the cerium oxide powder.

BACKGROUND ART

In general, there has been a tendency to increase the diameter of a wafer in current semiconductor fabrication processes so as to accomplish high integration of a ULSI (ultralarge scale integrated circuit). Also, current semiconductor fabrication has been subjected to more strict standards including the minimum width requirement of 0.13 µm or less. Further, a step of forming a multiple interconnection or multilayer interconnection structure on a wafer is essentially required for improving the quality of a semiconductor device. However, non-planarization of wafer occurring after carrying out one of the above techniques causes many problems, such as a drop in the margin in the subsequent steps or degradation of the quality of a transistor or device. Therefore, planarization processes have been applied to various steps so as to solve such problems.

One of these planarization techniques is CMP (chemical mechanical polishing). During the process of CMP, a wafer surface is pressed against a polishing pad that rotates relative to the surface, and chemically reactive slurry is introduced into the polishing pad during the polishing process. Such a CMP technique accomplishes planarization of a wafer surface by way of chemical and physical actions.

Such a CMP technique may be applied to a shallow trench isolation (STI) process, and particularly in a step of polishing an insulating silicon oxide layer 104 until a silicon nitride etch-stop layer 102 is exposed, after depositing the insulating silicon oxide layer 104 so that a trench 103 on a wafer may be embedded therein (see (b) and (c) in FIG. 1). Herein, the silicon nitride layer has a higher strength and hardness as compared to the silicon oxide layer by about three times, and thus the polishing rate of the silicon oxide layer is higher than that of the silicon nitride layer. It is preferable that no silicon nitride layer is removed. In other words, it is ideal that the polishing rate of the silicon oxide layer to the silicon nitride layer (referred to also as 'polishing selectivity of the insulating silicon oxide layer to the silicon nitride layer' hereinafter) is infinite.

However, conventional CMP slurry has a low polishing selectivity of the insulating silicon oxide layer to the silicon nitride layer, which is about 4:1. Hence, the silicon nitride layer is polished to a degree exceeding the acceptable range in a practical CMP process. As a result, the silicon nitride layer pattern may be removed non-uniformly depending on locations in a wafer during a CMP process. Therefore, the silicon nitride etch-stop layer has a significantly variable thickness over the whole wafer. During an STI process, this causes a level difference between active regions and field regions in a final structure having a trench formed thereon, resulting in a drop in the process margin of the subsequent steps for manufacturing a semiconductor device, and degradation of the quality of a transistor and a device. Particularly, this is a serious problem in the case of a semiconductor wafer that has patterns having different densities at the same time.

In addition to the aforementioned problem of local planarization, the conventional CMP process shows low within-wafer non-uniformity (WIWNU). In other words, during the polishing according to the conventional CMP process, the central portion of a wafer is predominantly polished as compared to the circumferential portion thereof, resulting in formation of a longitudinal section having a U-like or W-like overall shape. It is thought that this is because the mechanical pressure pressurizing the wafer and polishing pad is distributed non-uniformly, so that the polishing slurry or polishing particles cannot be distributed uniformly and the central portion of the wafer is subjected to a relatively high polishing rate.

To solve the above problem related with WIWNU, a practical semiconductor fabrication process adopts a larger processing margin for a silicon nitride layer so as to ensure reliable termination of CMP. For example, the silicon nitride layer has a larger initial thickness to compensate for the difference in thickness of the silicon nitride layer between the central portion and the circumferential portion of the wafer after polishing. However, this results in degradation of the cost-efficiency of the process.

DISCLOSURE

Technical Problem

Therefore, the present invention has been made in view of the above-mentioned problems. The inventors of the present invention have found that when cerium oxide powder obtained by calcination of cerium carbonate is used as an abrasive of CMP slurry, the polishing selectivity of a silicon oxide layer to a silicon nitride layer or WIWNU during a CMP process is significantly affected by the crystal structure of cerium carbonate.

Also, the inventors of the present invention have found that when cerium oxide powder, obtained by using cerium carbonate having a hexagonal crystal structure as a precursor, is used as an abrasive for CMP slurry, either or both of the polishing selectivity of a silicon oxide layer to a silicon nitride layer and WIWNU can be improved.

The present invention is based on these findings.

Technical Solution

According to an aspect of the present invention, there is provided a method for preparing cerium oxide powder by using cerium carbonate having a hexagonal crystal structure as a precursor.

According to another aspect of the present invention, there is provided cerium oxide powder comprising at least 50 vol % of hexagonal plate-like particles having at least one edge with an angle of 120°±20°; CMP slurry comprising the cerium oxide powder as an abrasive; and a shallow trench isolation process for a semiconductor device characterized by using the CMP slurry as polishing slurry.

According to still another aspect of the present invention, there is provided a method for controlling either or both of the polishing selectivity of a silicon oxide layer to a silicon nitride layer and WIWNU by using cerium oxide prepared from cerium carbonate having a hexagonal crystal structure as an abrasive for CMP slurry.

Hereinafter, the present invention will be explained in more detail.

In general, CMP slurry comprises an abrasive, a dispersant and water.

Many attempts have been made to date to improve the polishing characteristics of CMP slurry, including the polishing selectivity of a silicon oxide layer to a silicon nitride layer and WIWNU, by modifying the chemical composition of the CMP slurry through the use of a dispersion stabilizer or additive.

Meanwhile, generally it has been thought that polishing based on the conventional abrasive, such as cerium oxide, is performed by a mechanical polishing as a main polishing mechanism, the mechanical polishing is accomplished by repeating a series of steps including (i) hydration of the surface subjected to polishing (the resultant thereof being '—Si(OH)$_3$'); (ii) mechanical removal of the hydrated layer by an abrasive, and (iii) dispersion and dissolution of the removed silicon hydrate (Si(OH)$_4$) in a solution.

Additionally, it is disclosed in a known thesis (Journal of Non-Crystalline Solids, 283 (2001) pp 129-136) that when cerium oxide is used as an abrasive, the cerium oxide can act chemically to a silicon oxide layer. That is, the cerium oxide can polish a silicon oxide layer chemically by a mechanism wherein Si—O—Ce chemical bonding occurs due to the high reactivity between cerium oxide and silicon oxide, and cerium oxide removes silicon oxide from the surface of the silicon oxide layer in such a manner that the silicon oxide lumps are torn off.

In other words, when cerium oxide is used as an abrasive, the polishing rate of a silicon nitride layer and that of a silicon oxide layer may be affected by the physicochemical properties of cerium oxide. Also, the polishing selectivity of the silicon oxide layer to the silicon nitride layer and WIWNU depend on the polishing rates of the silicon nitride layer and silicon oxide layer. Therefore, it is necessary to improve the physicochemical properties of cerium oxide in order to improve the polishing selectivity of the silicon oxide layer to the silicon nitride layer or WIWNU.

In a part of such improvement, calcination conditions may be changed during the preparation of cerium oxide via a solid phase process. Cerium oxide may be prepared by calcination of cerium carbonate at high temperature, and the resultant cerium oxide has variable physicochemical properties depending on the calcination conditions, such as the calcination temperature or calcination process. Therefore, it is estimated that the polishing selectivity of the silicon oxide layer to the silicon nitride layer and WIWNU can be controlled by adjusting the polishing rates of the silicon nitride layer and silicon oxide layer through the modification of the calcination conditions of cerium carbonate.

However, according to the experiments conducted by the inventors of the present invention, the polishing selectivity of the silicon oxide layer to the silicon nitride layer and WIWNU are affected by the crystal structure of cerium carbonate rather than the calcination conditions of cerium carbonate. That is, it could be seen from the experimental results that while the polishing rates of the silicon nitride layer and silicon oxide layer increase as the calcination temperature of calcium carbonate increases, the polishing selectivity of the silicon oxide layer to the silicon nitride layer and WIWNU does not significantly depend on the calcination temperature of cerium carbonate but are significantly affected by the crystal structure of cerium carbonate.

Therefore, the inventors of the present invention thought that the crystal structure of cerium carbonate as a precursor for preparing cerium oxide powder is the most important factor affecting the polishing selectivity of the silicon oxide layer to the silicon nitride layer and WIWNU. As a result, the present invention provides cerium oxide powder that can impart excellent polishing selectivity of the silicon oxide layer to the silicon nitride layer and WIWNU as an abrasive for CMP slurry. More particularly, the present invention is characterized by using cerium oxide powder as an abrasive for CMP slurry, the cerium oxide powder being prepared by using cerium carbonate having a hexagonal crystal structure as a precursor.

Cerium carbonate as a precursor for cerium oxide has different crystal structures depending on the amounts of carbonate functional groups and hydroxyl groups adsorbed thereto. Therefore, even when applying the same oxidation process for preparing cerium oxide, the resultant cerium oxide may have different crystallinities, specific surface areas, pore distributions, hardness, or the like, depending on the crystal structure of cerium carbonate.

For example, cerium oxide prepared by using cerium carbonate having a hexagonal crystal structure as a precursor comprises grains with a uniform size bound weakly among themselves. Therefore, when such cerium oxide is used as an abrasive, the grains are crushed into a uniform size by the mechanical force applied from the polishing pad and perform polishing of the surface to be polished. Thus, it is possible to provide excellent WIWNU over the whole wafer.

Additionally, such cerium oxide is more easily crushed upon polishing of silicon nitride layer having a higher hardness, so that it can be converted into small particles and can significantly reduce the polishing rate of the silicon nitride layer. Meanwhile, since the cerium oxide has a broad pore size distribution and excellent chemical surface activity, it shows an increased chemical polishing rate upon polishing of the silicon oxide layer, and maintains an excellent polishing rate while causing no significant drop in the polishing rate of the silicon oxide layer. Therefore, when the cerium oxide powder according to the present invention is used as an abrasive, it is possible to increase the polishing selectivity of the silicon oxide layer to the silicon nitride layer.

More particularly, when cerium oxide prepared by using cerium carbonate having a hexagonal crystal structure as a precursor is used as an abrasive for CMP slurry according to the present invention, the polishing selectivity of the silicon oxide layer to the silicon nitride layer may be at least 30, and the delta WIWNU (within-Wafer Non-Uniformity) (%) may be 10% or less. The above polishing selectivity and WIWNU are improved when compared to the CMP results obtained by using cerium oxide powder prepared from cerium carbonate having an orthorhombic crystal structure or lanthanite-(Ce) cerium carbonate as a precursor. Herein, the delta WIWNU (%) is defined as the standard deviation in thickness of a wafer divided by the average thickness after polishing. Generally, a lower delta WIWNU value indicates a higher planarization degree.

Meanwhile, the cerium oxide obtained according to the present invention has low hardness and can be crushed with ease, and thus solves a micro-scratch problem caused by coarse particles.

The cerium oxide powder obtained by using cerium carbonate having a hexagonal crystal structure as a precursor according to the present invention may have a hexagonal plate-like particle shape.

The inventors of the present invention have studied about cerium oxide powder and have found that cerium oxide powder prepared via a solid phase process frequently maintains the shape and size of cerium carbonate particles used as a precursor. The cerium oxide powder according to the present invention is obtained by using cerium carbonate having a hexagonal crystal structure as a precursor, and such cerium carbonate having a hexagonal crystal structure frequently has a hexagonal plate-like particle shape. Thus, the cerium oxide powder according to the present invention may have a hexagonal plate-like particle shape.

Therefore, the cerium oxide powder according to the present invention may include hexagonal plate-like particles having at least one edge with an angle of $120°±20°$, and preferably of $120°±10°$. Additionally, the cerium oxide powder may comprise at least 50 vol % of the hexagonal plate-like particles based on the total volume thereof. Such proportion can be determined statistically from multiple sheets of photographs taken by scanning electron microscopy (SEM).

Meanwhile, the cerium oxide powder according to the present invention preferably has a crystallite size of 5 nm~60 nm. If the crystallite size is less than 5 nm, polishing rate decreases. If the crystallite size is greater than 60 nm, the surface subjected to polishing may be severely scratched. The crystallite size is calculated by using the Scherrer Equation after measuring the half width of the main peak of cerium oxide with an X-ray diffractometer.

There is no particular limitation in the method for preparing the cerium oxide powder according to the present invention, as long as the method includes a step of carrying out calcination of cerium carbonate having a hexagonal crystal structure.

Preferably, the method for preparing the cerium oxide powder according to the present invention comprises the steps of:

(a) carrying out the first calcination of cerium carbonate having a hexagonal crystal structure; and (b) carrying out the second calcination of the powder obtained from the first calcination step at a temperature higher than the first calcination temperature.

Step (a) is a step of carrying out the first calcination (heat treatment) of cerium carbonate having a hexagonal crystal structure so that the cerium carbonate undergoes a phase transition into cerium oxide.

Herein, there is no particular limitation in the cerium carbonate, as long as the cerium carbonate has a hexagonal crystal structure. Any cerium carbonate generally known to those skilled in the art may be used. The cerium carbonate may be obtained by using the conventional method currently used in the art. For example, the cerium carbonate may be prepared by carrying out precipitation between cerium nitrate and ammonium carbonate, or by carrying out a hydrothermal reaction between them under high pressure.

Additionally, there is no particular limitation in the particle size of the cerium carbonate having a hexagonal crystal structure. Preferably, the cerium carbonate has an average particle diameter of 0.1~20 μm. If the cerium carbonate has an average diameter of less than 0.1 μm, the final cerium oxide powder may have an average diameter of less than 50 nm, resulting in a significant drop in the polishing rate. If the cerium carbonate has an average diameter of greater than 20 μm, pulverization and dispersion of the powder obtained from the second calcination step require a long period of time, and the final cerium oxide powder has a broad particle size distribution.

Meanwhile, the first calcination step may be carried out by heat treating the cerium carbonate at a temperature of 200~400° C. for 6~100 hours. If the first calcination temperature is lower than 200° C., complete phase transition from cerium carbonate from cerium oxide cannot be accomplished. If the first calcination temperature is higher than 400° C., the finally formed cerium oxide has an undesirably large particle size or undesirably high hardness, so that the silicon nitride layer may be subjected to a high polishing rate (the polishing selectivity of the silicon oxide layer to the silicon nitride layer decreases), or the surface to be polished may cause micro-scratches.

Additionally, when the cerium oxide obtained from the first calcination step is subjected to the second calcination (heat treatment) step in step (b), the cerium oxide crystals grow to increase the size of crystallites and to form powder having a broad pore size distribution. Therefore, when the resultant cerium oxide powder is used as an abrasive, it is possible to improve the polishing selectivity of the silicon oxide layer to the silicon nitride layer and/or WIWNU.

The second calcination (heat treatment) step may be performed at a temperature of 600~1,200° C., and preferably of 800~900° C. for 30 minutes~6 hours. If the second calcination temperature is out of the above range, the polishing rate of the silicon nitride layer may increase.

Although the first and the second calcination steps may be carried out in the air, calcination under oxygen atmosphere is preferred. Additionally, calcination may be carried out by using conventional heaters, such as a box type furnace, an automatic conveyance type continuous furnace or a rotary continuous furnace.

Meanwhile, the method for preparing cerium oxide may optionally further comprise a step of crushing the powder obtained from the first calcination step between step (a) and step (b).

The crushing step is for pre-treating coarse particles by pulverizing them so as to allow the subsequent reaction can be performed more uniformly in the second calcination step. The cerium oxide powder obtained from the crushing step may have an average diameter of 0.03~0.2 μm.

Any conventional crushing method known to those skilled in the art can be used with no particular limitation, and a dry crushing method is preferred. Non-limiting examples of such methods include a jet mill process, disk mill process, beads mill process, or the like.

Meanwhile, the CMP slurry according to the present invention comprises an abrasive, a dispersant and water, wherein the abrasive is cerium oxide powder obtained by using cerium carbonate having a hexagonal crystal structure as a precursor.

The cerium oxide powder is preferably used in an amount of 0.1~50 parts by weight per 100 parts by weight of the slurry. If the abrasive, cerium oxide powder, is used in an amount of less than 0.1 parts by weight, the polishing rate of the silicon oxide layer may significantly decrease. If the cerium oxide powder is used in an amount of greater than 50 parts by weight, the resultant slurry may have an undesirably high viscosity, and thus cannot be present as stable slurry during the dispersion and polishing steps.

The dispersant that may be used in the present invention includes a non-ionic polymeric dispersant or an anionic polymeric dispersant. The non-ionic polymeric dispersant includes at least one compound selected from the group consisting of polyvinyl alcohol (PVA), ethylene glycol (EG), glycerin, polyethylene glycol (PEG), polypropylene glycol (PPG) and polyvinyl pyrrolidone (PVP). The anionic polymeric dispersant includes at least one compound selected from the group consisting of polyacrylic acid, ammonium polyacrylate and polyacrylmaleic acid. However, the scope of the present invention is not limited thereto.

The dispersant is preferably used in an amount of 0.5~10 parts by weight per 100 parts by weight of the abrasive. If the dispersant is used in an amount of less than 0.5 parts by weight, the slurry has lower dispersibility and causes rapid precipitation. Thus, the abrasive cannot be supplied uniformly while the polishing slurry is conveyed due to such precipitation (solid-liquid separation). If the dispersant is used in an amount of greater than 10 parts by weight, it is not possible to realize a sufficient level of polishing selectivity during the polishing step.

Preferably, the CMP slurry is titrated to pH 6~8 after the cerium oxide powder and the dispersant are mixed with water. For the titration, 1N KOH or 1N $HNO_3$ may be used.

After the completion of the titration, it is preferable to perform a dispersion stabilization step to improve the dispersion stability and shelf stability of the CMP slurry. The dispersion stabilization step is preferably performed via a wet crushing/dispersion process capable of controlling the particle size finely and accurately. Such processes include a ball mill process, attrition mill process, or the like.

Herein, in the finally formed CMP slurry obtained after the dispersion stabilization step, the cerium oxide powder preferably has a maximum particle size of less than 3 μm and an average particle diameter of 50~1,000 nm. If the cerium oxide powder has an average particle diameter of less than 50 nm, the polishing rate of the surface to be polished is too low. If the cerium oxide powder has an average particle diameter of greater than 1,000 nm, the polishing rate of the silicon nitride layer increases (the polishing selectivity decreases), the surface causes micro-scratches, or the slurry has low shelf stability. The above particle size is measured by using a particle size distribution measuring system (Horiba LA-910).

The CMP slurry according to the present invention comprises the abrasive, the dispersant and other additives, each in a predetermined amount, and further comprises the balance amount of water.

Meanwhile, the CMP slurry according to the present invention may further comprise additives for improving the polishing quality. Such additives include a monomer substance having a weight average molecular weight of 500 or less and containing either or both of hydroxyl (OH) groups and carboxyl groups (COOH), a linear polymer substance having a weight average molecular weight of 2,000~50,000, or a graft type polyelectrolyte having a weight average molecular weight of 1,000~20,000, but are not limited thereto.

Further, the present invention provides an STI (shallow trench isolation) method using the aforementioned CMP slurry as polishing slurry. The STI method may be performed according to a process currently used in the art.

For example, the STI method comprises the steps of:

(a) stacking a pad silicon oxide ($SiO_2$) layer 101 and a silicon nitride etch-stop layer 102 successively on a semiconductor wafer 100, forming a photoresist pattern, and partially etching the photoresist pattern by using a mask to form trenches 103 having a predetermined depth;

(b) depositing an insulating silicon oxide layer 104 so that the trenches are embedded therein;

(c) polishing (CMP) the insulating silicon oxide layer 104 until the silicon nitride etch-step layer 102 is exposed; and (d) removing the pad silicon oxide layer 101 and the silicon nitride etch-step layer 102 via etching, and forming a gate silicon oxide layer 105 on the semiconductor wafer (see FIG. 1).

Further, the present invention provides a method for controlling either or both of the polishing selectivity of the silicon oxide layer to the silicon nitride layer and WIWNU during a CMP process using cerium oxide as an abrasive, the cerium oxide being obtained from cerium carbonate having a hexagonal crystal structure. Herein, the polishing selectivity of the silicon oxide layer to the silicon nitride layer may be at least 30, and the delta WIWNU (%) may be 10% or less.

MODE FOR INVENTION

Reference will now be made in detail to the preferred embodiments of the present invention. It is to be understood that the following examples are illustrative only and the present invention is not limited thereto.

Example 1

<Preparation of Cerium Oxide Powder>

Figure 1:
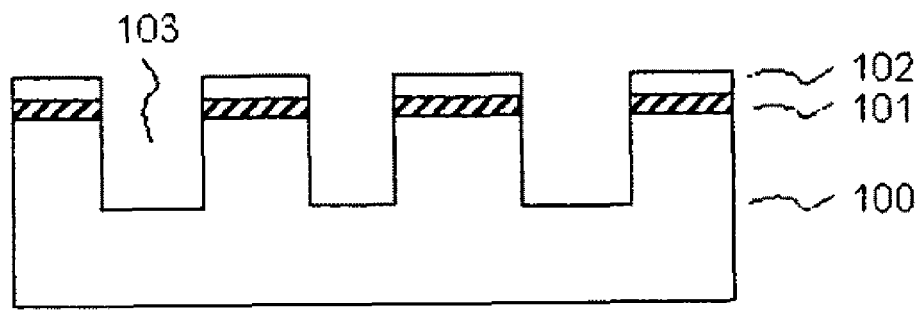
FIG. 1 is a schematic view showing a general shallow trench isolation (STI) process;
100: a semiconductor wafer
101: a pad silicon oxide ($SiO_2$) layer
102: a silicon nitride etch-stop layer
103: a trench
104: a insulating silicon oxide layer
105: a gate silicon oxide layer 105.
Figure 1:
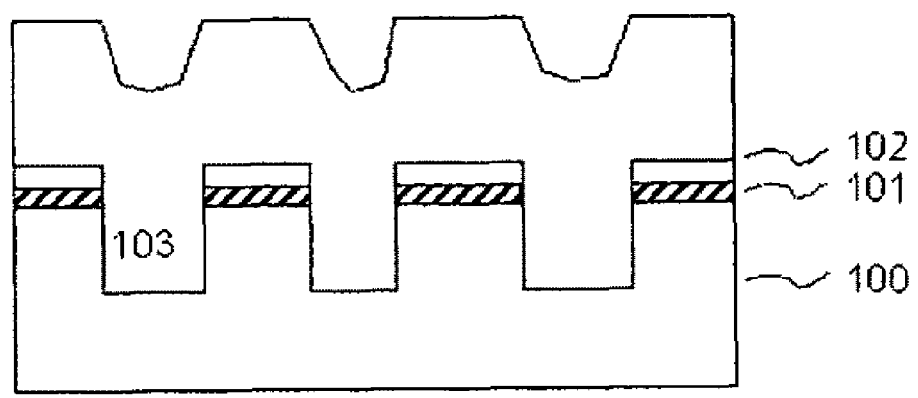
Figure 1:
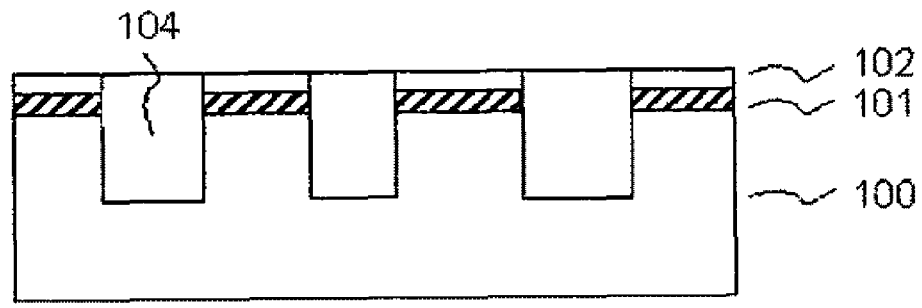
Figure 1:
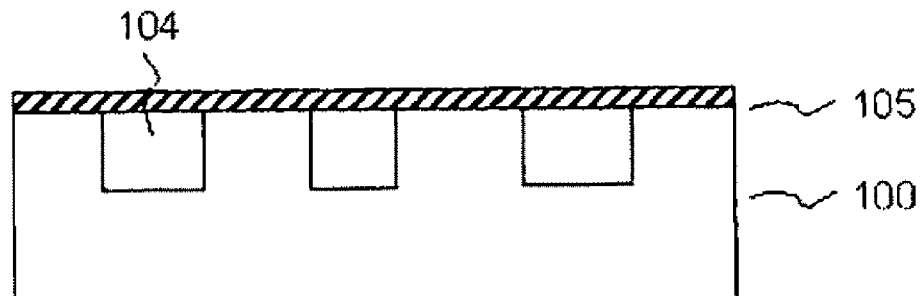
Figure 2:
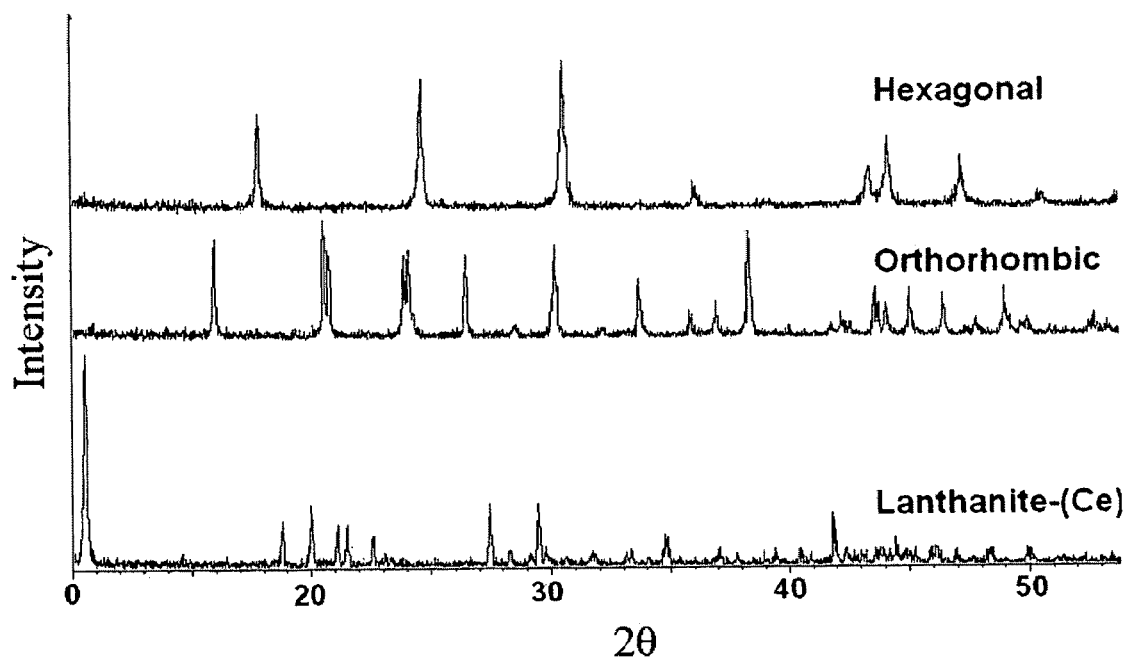
FIG. 2 is the X-ray diffraction (XRD) diagram of the cerium carbonate used as a precursor for cerium oxide powder according to the examples and comparative examples.

First, 1 kg of cerium carbonate powder having a hexagonal crystal structure (see XRD data in FIG. 2) was charged into an alumina crucible, was calcined at 350° C. for 12 hours under oxidative atmosphere to which air is fed sufficiently, and was crushed by using a jet mill. The crushed powder is further calcined at 750° C. for 2 hours to obtain light yellow-colored cerium oxide powder.

Figure 3:
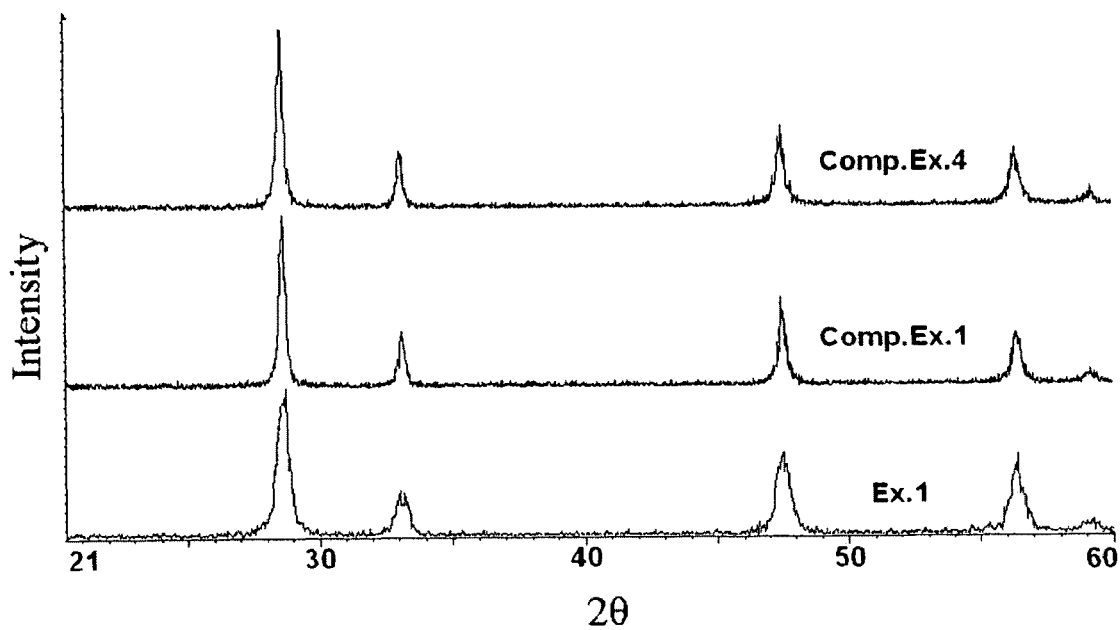
FIG. 3 is the X-ray diffraction (XRD) diagram of the cerium oxide powder obtained according to examples and comparative examples.
Figure 4:
FIG. 4 is a photographic view of the cerium carbonate powder used in Example 1, taken by scanning electron microscopy (SEM).

After analyzing the powder by XRD, it can be seen that a complete phase transition from cerium carbonate into cerium oxide is accomplished, as shown in FIG. 3.

Figure 5:
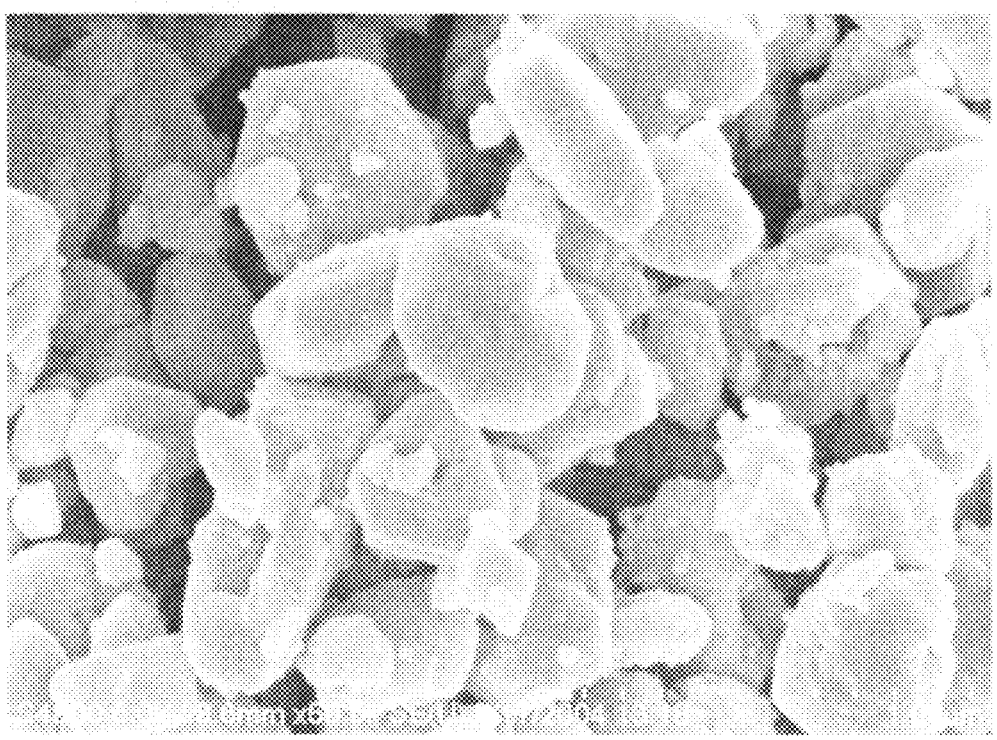
FIG. 5 is a photographic view of the cerium oxide powder obtained from Example 1, taken by SEM.

FIG. 5 is a photograph of the cerium oxide powder taken by SEM.

<Preparation of CMP Slurry>

A cerium oxide dispersion was prepared by using 0.5 kg of the cerium oxide powder obtained as described above, 25 g of a dispersant (polyacrylic acid available from Aldrich) and 5 L of pure water. The cerium oxide dispersion was titrated to pH 7.5 with aqueous ammonia, and subjected to a dispersion stabilization and particle size modification step using a ball mill. Herein, 1 kg of zirconia beads with a size of 1 mm were used in the ball mill and the ball mill was operated at a speed of 250 rpm for 2 hours.

The cerium oxide dispersion was filtered with a 1 μm filter, and pure water was added thereto so that the content of the cerium oxide is 1 part by weight per 100 parts by weight of the total mixture to provide cerium oxide slurry. The cerium oxide had an average particle diameter of 180 nm and a particle size distribution of about 70~300 nm, as measured by using a particle size distribution measuring system (Horiba LA-910).

Meanwhile, ammonium hydroxide ($NH_4OH$) was added to 1 wt % of aqueous gluconic acid solution to a pH of 7.2 to form a mixed gluconic acid solution.

Then, 2 parts by weight of the mixed gluconic acid solution was mixed with 100 parts by weight of the cerium oxide powder to provide final CMP slurry.

Example 2

Cerium oxide powder and CMP slurry comprising the same were provided in the same manner as described in Example 1, except that the second calcination step was carried out at 850° C. for 2 hours. The cerium oxide powder dispersed in the CMP slurry had an average particle diameter of 176 nm and a particle size distribution of 70~300 nm.

Example 3

Cerium oxide powder and CMP slurry comprising the same were provided in the same manner as described in Example 1, except that the second calcination step was carried out at 950° C. for 2 hours. The cerium oxide powder dispersed in the CMP slurry had an average particle diameter of 182 nm and a particle size distribution of 70-300 nm.

Comparative Example 1

Cerium oxide powder and CMP slurry comprising the same were provided in the same manner as described in Example 1, except that cerium carbonate having an orthorhombic crystal structure (see XRD data in FIG. 2) was used for preparing the cerium oxide powder.

XRD analysis results of the cerium oxide are shown in FIG. 3.

Meanwhile, the cerium oxide powder dispersed in the CMP slurry had an average particle diameter of 188 nm and a particle size distribution of 70~300 nm.

Comparative Example 2

Cerium oxide powder and CMP slurry comprising the same were provided in the same manner as described in Comparative Example 1, except that the second calcination step was carried out at 850° C. for 2 hours. The cerium oxide powder dispersed in the CMP slurry had an average particle diameter of 181 nm and a particle size distribution of 70~300 nm.

Comparative Example 3

Cerium oxide powder and CMP slurry comprising the same were provided in the same manner as described in Comparative Example 1, except that the second calcination step was carried out at 950° C. for 2 hours. The cerium oxide powder dispersed in the CMP slurry had an average particle diameter of 184 nm and a particle size distribution of 70~300 nm.

Comparative Example 4

Cerium oxide powder and CMP slurry comprising the same were provided in the same manner as described in Example 1, except that lanthanite-(Ce) cerium carbonate (see XRD data in FIG. 2) was used for preparing the cerium oxide powder.

XRD analysis results of the cerium oxide are shown in FIG. 3.

Meanwhile, the cerium oxide powder dispersed in the CMP slurry had an average particle diameter of 183 nm and a particle size distribution of 70~300 nm.

Comparative Example 5

Cerium oxide powder and CMP slurry comprising the same were provided in the same manner as described in Comparative Example 4, except that the second calcination step was carried out at 850° C. for 2 hours. The cerium oxide powder dispersed in the CMP slurry had an average particle diameter of 180 nm and a particle size distribution of 70~300 nm.

Comparative Example 6

Cerium oxide powder and CMP slurry comprising the same were provided in the same manner as described in Comparative Example 1, except that the second calcination step was carried out at 950° C. for 2 hours. The cerium oxide powder dispersed in the CMP slurry had an average particle diameter of 181 nm and a particle size distribution of 70~300 nm.

Experimental Example 1

The CMP slurry according to Examples 1~3 and Comparative Examples 1~6 was used in a polishing step for 1 minute under the following conditions. The substrate was washed thoroughly to measure the variation in the thickness after the polishing and to evaluate the polishing quality. The results are shown in the following Table 1.

[Polishing Conditions]

Polishing system: GNP POLY 400 (GNP Technology)

Polishing pad: polyurethane pad

Platen speed: 90 rpm

Carrier speed: 90 rpm

Pressure: 4 psi

Slurry flow rate: 100 ml/min.

[Objects to be Polished]

A silicon oxide ($SiO_2$) wafer on which a $SiO_2$ layer is deposited to 7000 Å from PECVD (plasma-enhanced chemical vapor deposition)

A silicon nitride (SiN) wafer on which a SiN layer is deposited to 1500 Å from LPCVD (low pressure chemical vapor deposition)

[Evaluation]

The variation in the thickness of each layer after polishing was measured by using an optical thickness measuring system, i.e. Nanospec 6100 (Nanometrics Co.).

Delta uniformity (Delta Within Wafer Non-Uniformity) was calculated according to the Standard Deviation Uniformity (ASTM).

TABLE 1

| Item | Crystal structure of cerium carbonate | Second calcination | Polishing rate of silicon oxide layer (Å/min) | Polishing rate of silicon nitride layer (Å/min) | Delta WIWNU (%) | Polishing selectivity |
|---|---|---|---|---|---|---|
| Ex. 1 | Hexagonal | 750° C. | 3444 | 88 | 5.14 | 39 |
| Ex. 2 | Hexagonal | 850° C. | 4099 | 95 | 2.78 | 43 |
| Ex. 3 | Hexagonal | 950° C. | 4118 | 124 | 6.14 | 33 |
| Comp. Ex. 1 | Lanthanite-(Ce) | 750° C. | 3677 | 108 | 12.60 | 34 |
| Comp. Ex. 2 | Lanthanite-(Ce) | 850° C. | 4327 | 114 | 12.14 | 38 |
| Comp. Ex. 3 | Lanthanite-(Ce) | 950° C. | 4414 | 184 | 16.7 | 24 |
| Comp. Ex. 4 | Orthorhombic | 750° C. | 3772 | 130 | 12.4 | 29 |
| Comp. Ex. 5 | Orthorhombic | 850° C. | 4222 | 324 | 17.4 | 13 |
| Comp. Ex. 6 | Orthorhombic | 950° C. | 4978 | 963 | 26.7 | 5 |

It can been seen from the above experimental results that the polishing rate of the silicon oxide layer and that of the silicon nitride layer increase as the second calcination temperature increases. Particularly, the polishing rate of the silicon oxide layer and that of the silicon nitride layer are not significantly affected by the crystal structure of cerium carbonate, but are affected by the second calcination temperature of cerium carbonate.

Meanwhile, WIWNU is not significantly affected by the second calcination temperature of cerium carbonate, but is significantly affected by the crystal structure of cerium carbonate. Particularly, the CMP slurry of Examples 1~3 using the cerium oxide powder obtained from cerium carbonate having a hexagonal crystal structure according to the present invention shows a delta WIWNU value improved by about 4~10 times as compared to the CMP slurry of Comparative Examples 1~6.

Additionally, the CMP slurry of Examples 1~3 shows the lowest polishing rate of the silicon nitride layer at the second calcination temperature ranging from 800° C. to 900° C., resulting in the highest polishing selectivity. This indicates that when the cerium oxide powder obtained by using cerium carbonate having a hexagonal structure as a precursor is used as an abrasive, the polishing selectivity of the silicon oxide layer to the silicon nitride layer depends less on the second calcination temperature, as compared to other cerium oxide powder obtained from cerium carbonate having a different crystal structure.

INDUSTRIAL APPLICABILITY

As can be seen from the foregoing, the cerium oxide powder according to the present invention is obtained by using cerium carbonate having a hexagonal crystal structure. When the cerium oxide powder is used as an abrasive for CMP slurry, it is possible to provide a sufficient polishing rate of a silicon oxide layer while significantly reducing a polishing rate of a silicon nitride layer, and thus to improve the polishing selectivity of the silicon oxide layer to the silicon nitride layer and WIWNU.

Additionally, such improved planarization of a wafer for fabricating a semiconductor device can improve the reliability and productivity of the device, and can contribute to improvement in integration degrees of ultra-miniature semiconductor devices.

Although several preferred embodiments of the present invention have been described for illustrative purposes, those skilled in the art will appreciate that various modifications, additions and substitutions are possible, without departing from the scope and spirit of the invention as disclosed in the accompanying claims.

The invention claimed is:

1. A cerium oxide powder obtained by calcinating a cerium oxide precursor that is selected to produce a cerium oxide powder comprising 50 vol % or more of hexagonal plate-like particles having at least one edge with an angle of 120°±20°, wherein said precursor is cerium carbonate having hexagonal crystal structure, and the cerium oxide powder comprises crystallites having an average size of 5 nm~60 nm.

2. The cerium oxide powder as claimed in claim 1, wherein the cerium oxide powder provides a CMP slurry with a polishing selectivity of a silicon oxide layer to a silicon nitride layer of 30 or more.

3. The cerium oxide powder as claimed in claim 1, wherein the cerium oxide powder has a delta WIWNU (within wafer non-uniformity) of 10% or less.

4. A CMP slurry comprising an abrasive, a dispersant and water, wherein the abrasive comprises the cerium oxide powder as defined in claim 1.

5. The CMP slurry as claimed in claim 4, wherein the CMP slurry comprises the cerium oxide powder in an amount of 0.1~50 parts by weight per 100 parts by weight of the CMP slurry, and the dispersant in an amount of 0.5~10 parts by weight per 100 parts by weight of the abrasive.

6. The CMP slurry as claimed in claim 4, wherein the dispersant is a non-ionic polymer or an anionic polymer.

7. The CMP slurry as claimed in claim 4, wherein the dispersant is at least one selected from the group consisting of polyvinyl alcohol, ethylene glycol, glycerin, polyethylene glycol, polypropylene glycol, polyvinyl pyrrolidone, polyacrylic acid, ammonium polyacrylate and polyacrylmaleic acid.

8. A shallow trench isolation (STI) method for a semiconductor device, comprising polishing an insulating silicon oxide layer in a wafer using the CMP slurry of claim 4.

* * * * *